(12) United States Patent
Wu et al.

(10) Patent No.: US 9,436,046 B2
(45) Date of Patent: Sep. 6, 2016

(54) PIXEL ARRAY

(71) Applicant: E Ink Holdings Inc., Hsinchu (TW)

(72) Inventors: Chi-Ming Wu, Hsinchu (TW); Shu-Ping Yan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/071,662

(22) Filed: Nov. 5, 2013

(65) Prior Publication Data

US 2014/0151723 A1    Jun. 5, 2014

(30) Foreign Application Priority Data

Dec. 5, 2012 (TW) .............................. 101145706 A

(51) Int. Cl.
  *H01L 27/12* (2006.01)
  *G02F 1/1343* (2006.01)
  *G02F 1/1362* (2006.01)

(52) U.S. Cl.
  CPC ... *G02F 1/134336* (2013.01); *G02F 1/134309* (2013.01); *G02F 1/136286* (2013.01); *H01L 27/124* (2013.01)

(58) Field of Classification Search
  None
  See application file for complete search history.

(56) References Cited

U.S. PATENT DOCUMENTS

| | | | | |
|---|---|---|---|---|
| 2006/0221092 A1* | 10/2006 | Noguchi et al. | | 345/589 |
| 2011/0273654 A1* | 11/2011 | Wang et al. | | 349/143 |
| 2011/0292331 A1* | 12/2011 | Chang et al. | | 349/138 |

* cited by examiner

*Primary Examiner* — Johannes P Mondt
(74) *Attorney, Agent, or Firm* — Jianq Chyun IP Office

(57) ABSTRACT

A pixel array includes multiple scan lines, multiple gate lines, multiple data lines and multiple pixel structures. The scan lines are disposed on a substrate. The gate lines intersect with the scan lines to demarcate multiple first unit regions and multiple second unit regions. Each gate line electrically connects to one of the scan lines. The data lines intersect with the scan lines and pass through the first unit regions. Each data line is located between two adjacent gate lines. The pixel structures are disposed on the first unit regions. Each pixel structure includes an active device and a pixel electrode. The active device is driven by one corresponding scan line and connects with one corresponding data line. An orthographic projection of each pixel electrode on the substrate is non-overlapped with or incompletely overlapped with an orthographic projection of the corresponding gate lines on the substrate.

10 Claims, 3 Drawing Sheets

PIXEL ARRAY

CROSS-REFERENCE TO RELATED APPLICATION

This application claims the priority benefit of Taiwan application serial no. 101145706, filed on Dec. 5, 2012. The entirety of the above-mentioned patent application is hereby incorporated by reference herein and made a part of this specification.

BACKGROUND

1. Field of the Invention

The invention relates to a display array. More particularly, the invention relates to a pixel array.

2. Description of Related Art

Generally speaking, a liquid crystal display panel is mainly composed of an active device matrix substrate, an opposite substrate and a liquid crystal layer sandwiched between the active device matrix substrate and the opposite substrate. The active device matrix substrate can be divided into a display region and a non-display region. A plurality of pixel units arranged as a matrix is disposed on the display region, and each of the pixel units includes a thin film transistor (TFT) and a pixel electrode connecting to the TFT. Additionally, a plurality of scan lines and a plurality of data lines are disposed in the display region, and the TFT of each of the pixel units is electrically connected to the corresponding scan lines and data lines. The signal lines, the source drivers and the gate drivers are disposed in the non-display region.

When the liquid crystal display panel is about to display image frames, the liquid crystal display panel has to turn on the pixels of each row in a display panel sequentially through the gate drivers, and the pixels of each row correspondingly receive data voltage provided by the source drivers within a turn-on time. Accordingly, the liquid crystal molecules of pixels of each row will be properly arranged based on the received data voltage. However, with enhanced resolution of the liquid crystal display panel, the liquid crystal display apparatus has to increase numbers of the gate drivers and the source drivers so as to match the enhancement of resolution, and an area of an non-display region (or border lines) is getting greater due to increased numbers of the gate drivers and the source drivers. Based on the above reasons, production costs of the liquid crystal display apparatus increase when numbers of the gate drivers and the source drivers increase, and in the meantime, border lines also gets wider and wider. If numbers of the gate drivers and/or the source drivers can be reduced, an issue that costs cannot be reduced can be easily solved and border lines will be narrower, which means a product with a smaller area of a non-display region can be manufactured.

SUMMARY OF THE INVENTION

The invention provides a pixel array to mitigate the mura phenomenon of a display panel.

The invention provides a pixel array adapted to be disposed on a substrate. The pixel array includes a plurality of scan lines, a plurality of gate lines, a plurality of data lines and a plurality of pixel structures. The scan lines are disposed on the substrate and arranged in parallel. The gate lines are arranged in parallel and intersect with the scan lines to demarcate a plurality of first unit regions and a plurality of second unit regions. Each gate line electrically connects to one of the scan lines, and an area of each second unit region is smaller than an area of each first unit region, and the first unit region and the second unit region are alternately arranged in a longitudinal direction. The data lines intersect with the scan lines and pass through the first unit regions, wherein each data line is located between two of the adjacent gate lines. The pixel structures are disposed on the first unit regions. Each pixel structure includes an active device and a pixel electrode connecting with the active device. The active device is driven by one corresponding scan line and connects with one corresponding data line. An orthographic projection of each pixel electrode on the substrate is non-overlapped with or incompletely overlapped with an orthographic projection of the corresponding gate lines on the substrate.

In an embodiment of the invention, an extending direction of the gate lines is parallel to an extending direction of the data lines.

In an embodiment of the invention, the gate lines and the scan lines are composed of different film layers, and the gate lines and the data lines are composed of a same film layer.

In an embodiment of the invention, the pixel array further includes a contact hole that electrically connects each gate line and one of the corresponding scan lines.

In an embodiment of the invention, each of the pixel electrodes extends and covers another corresponding scan line to form a storage capacitor.

In an embodiment of the invention, the pixel electrodes extend to the second unit regions and two adjacent pixel electrodes in a longitudinal direction are in an interlaced arrangement.

In an embodiment of the invention, an area of each of the pixel electrodes is greater than an area of each of the first unit regions.

In an embodiment of the invention, an area of each of the pixel electrodes is smaller than an area of each of the first unit regions.

In an embodiment of the invention, each of the pixel electrodes includes a first pixel electrode portion, a second pixel electrode portion, a third pixel electrode portion, a first pixel electrode connecting portion and a second pixel electrode connecting portion. The first pixel electrode portion is located between the second pixel electrode portion and the third pixel electrode portion. The first pixel electrode portion is located in the first unit region, and the second pixel electrode portion and the third pixel electrode portion are located in the second unit regions that are adjacent to two sides of the first unit regions, respectively. The first pixel electrode connecting portion connects the first pixel electrode portion and the second pixel electrode portion, and the second pixel electrode connecting portion connects the first pixel electrode portion and the third pixel electrode portion.

In an embodiment of the invention, an area of the first pixel electrode portion is greater than an area of the second pixel electrode portion and an area of the third pixel electrode portion. Orthographic projections of the first pixel electrode connecting portion and the second pixel electrode connecting portion on the substrate are partially overlapped with orthographic projections of the corresponding gate lines on the substrate.

Accordingly, since the orthographic projections of pixel electrodes on the substrate in the embodiments of the invention are non-overlapped with or incompletely overlapped with the orthographic projections of the corresponding gate lines on the substrate, a coupling effect can be reduced between the gate lines and the pixel electrodes with a design of the pixel array of the embodiments of the invention. Additionally, when the pixel array is further applied to a display panel, the mura phenomenon on the display panel can be substantially reduced and the display panel may have better display quality.

In order to make the aforementioned features and advantages of the invention more comprehensible, embodiments accompanied with figures are described in details below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
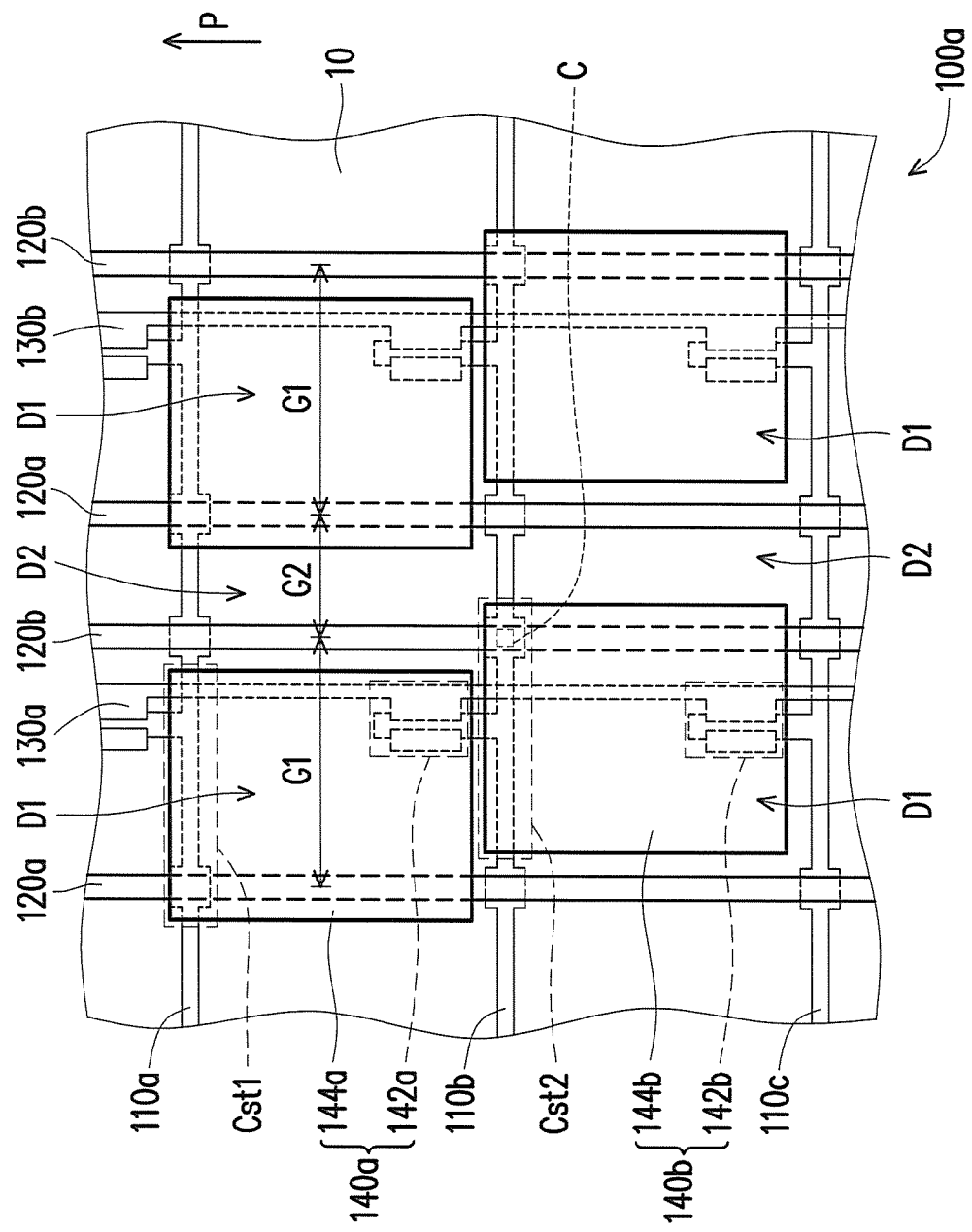
FIG. 1 illustrates a schematic view of a pixel array according to an embodiment of the invention.

FIG. 1 illustrates a schematic view of a pixel array according to an embodiment of the invention. Referring to FIG. 1, in the present embodiment, a pixel array 100a is adapted to be disposed on a substrate 10. The pixel array 100a includes a plurality of scan lines 110a, 110b and 110c, a plurality of gate lines 120a and 120b, a plurality of data lines 130a and 130b, and a plurality of pixel structures 140a and 140b.

Specifically, the scan lines 110a, 110b and 110c are disposed on the substrate 10 and are arranged in parallel. The gate lines 120a and 120b are arranged in parallel and intersect with the scan lines 110a, 110b and 110c to demarcate a plurality of first unit regions D1 and a plurality of second unit regions D2. Each of the gate lines 120a and 120b electrically connects to one of the scan lines 110a, 110b and 110c, and an area of each of the second unit regions D2 is smaller than an area of each of the first unit regions D1, and the first unit regions D1 and the second unit regions D2 are alternately arranged in a longitudinal direction P. The data lines 130a and 130b intersect with the scan lines 110a, 110b and 110c and pass through the first unit regions D1, wherein each of the data lines 130a and 130b is located between two adjacent gate lines 120a and 120b. The pixel structures 140a and 140b are disposed on the first unit regions D1, and each pixel structure 140a (or 140b) includes an active device 142a (or 142b) and a pixel electrode 144a (or 144b) connecting with the active device 142a (or 142b). The active device 142a (or 142b) is driven by one corresponding scan line 110b (or 110c) and connects with one corresponding data line 130a. An orthographic projection of each pixel electrode 144a (or 144b) on the substrate 10 is incompletely overlapped with an orthographic projection of the corresponding gate lines 120a and 120b on the substrate 10.

More specifically, in the present embodiment, an extending direction of the gate lines 120a and 120b is substantially parallel to an extending direction of the data lines 130a and 130b. The gate lines 120a and 120b and the scan lines 110a, 110b and 110c are composed of different film layers, and the gate lines 120a and 120b and the data lines 130a and 130b are composed of a same layer. Herein, the gate lines 120a and 120b are arranged in different pitches G1, G2. As shown in FIG. 1, the gate line 120b and the two adjacent gate lines 120a have different pitches G1, G2. Therefore, the first unit regions D1 and the second unit regions D2 defined by the gate lines 120a and 120b and the scan lines 110a, 110b and 110c have different areas.

Moreover, in the present embodiment, the pixel array 100a further includes a contact hole C, wherein the contact hole C electrically connects each gate line 120b and one of the corresponding scan lines 110b. In other words, the gate line 120b drives the scan line 110b through the contact hole C for the corresponding data line 130a to write a data signal into the pixel structure 140a. Additionally, in the present embodiment, each pixel electrode 144a (or 144b) further extends and covers another corresponding scan line 110a (or 110b) to form a storage capacitor Cst1 (or Cst2). When the pixel array 100a of the present embodiment is further applied to a display panel (not illustrated here), the display panel can maintain excellent display quality.

Specifically, the pixel electrodes 144a and 144b extends to the second unit regions D2, and the two adjacent pixel electrodes 144a and 144b in the longitudinal direction P are in a interlaced arrangement. An area of each pixel electrode 144a and 144b is substantially greater than an area of each first unit region D1. As shown in FIG. 1, the pixel electrode 144a overlaps with the gate line 120a, but does not overlap with the gate line 120b. Consequently, when the gate line 120b drives the scan line 110b through the contact hole C, the gate line 120b and the pixel electrode 144a do not have a coupling effect. For this reason, when the pixel array 100a of the present embodiment is further applied to a display panel (not illustrated here), the display panel may have better display quality, rather than having the mura phenomenon on the display panel caused by pressure difference generated between pixel electrodes due to the conventional coupling effect.

It should be noted that the reference numerals and a part of the contents in the aforementioned embodiment are used in the following embodiments, in which identical reference numerals are adopted to represent identical or similar components, and repeated descriptions of the same technical contents are omitted. For detailed descriptions of the omitted parts, a reference can be found in the aforementioned embodiment, and repeated descriptions thereof are omitted in the following embodiments.

Figure 2:
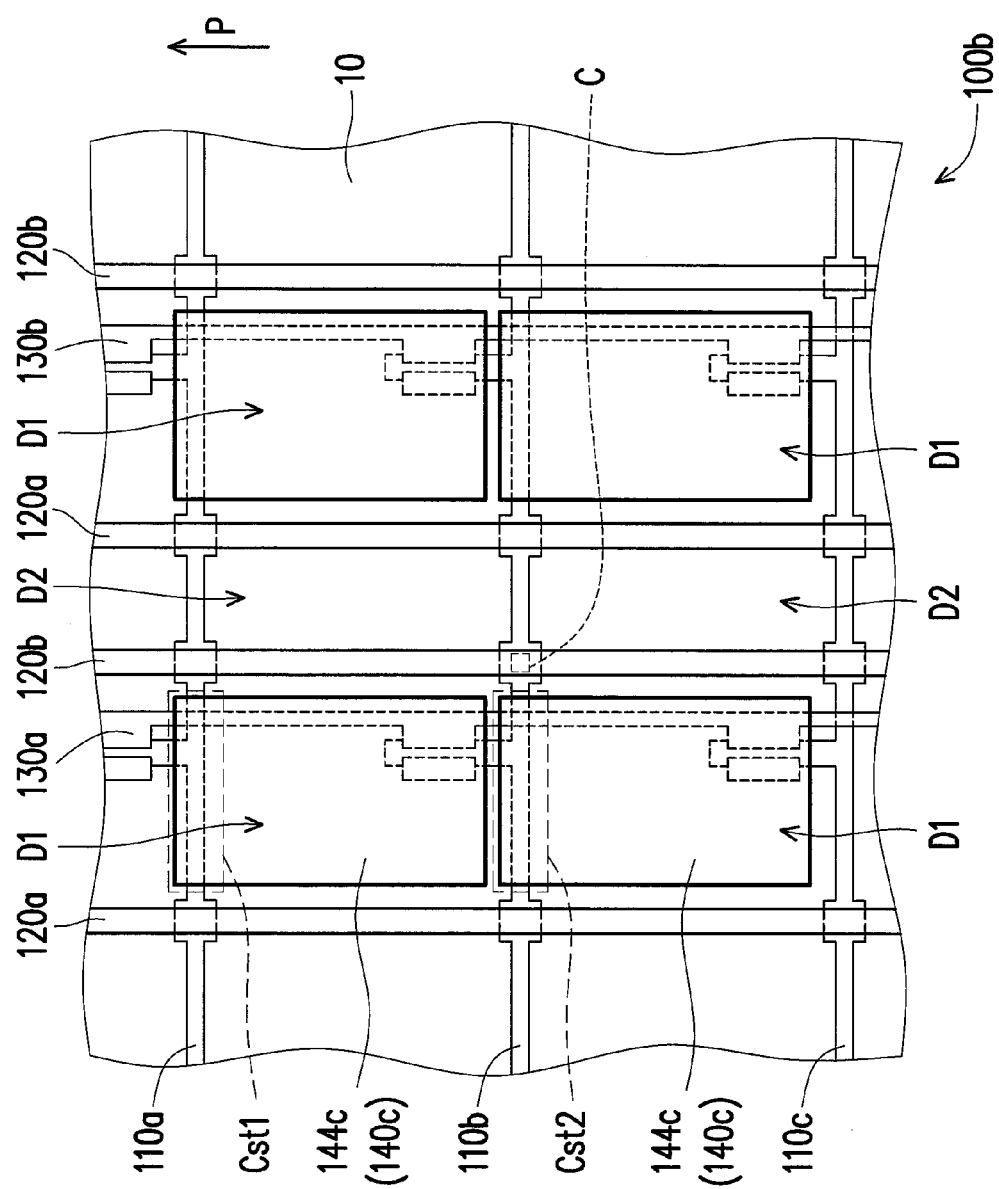
FIG. 2 illustrates a schematic view of a pixel array according to another embodiment of the invention.

FIG. 2 illustrates a schematic view of a pixel array according to another embodiment of the present invention. Referring to FIG. 1 and FIG. 2 together, a pixel array 100b of FIG. 2 is similar to the pixel array 100a of FIG. 1, while the main difference therebetween lies in that an area of each pixel electrode 144c of the pixel array 100b in the present embodiment is smaller than an area of each first unit region D1, and two adjacent pixel electrodes 140c in a longitudinal direction P are arranged in a straight line.

Since the area of each pixel electrode 144c of the present embodiment is smaller than the area of each first unit region D, that means the pixel electrode 144c of the present embodiment is exclusively disposed inside the first unit regions D1. In other words, an orthographic projection of each pixel electrode 144c on the substrate 10 is not overlapped with orthographic projections of the corresponding gate lines 120a and 120b on the substrate 10. Therefore, when the gate line 120b drives the scan line 110b through the contact hole C, the gate line 120b and the pixel electrode 144c therebetween do not have a coupling effect. For this reason, when the pixel array 100b of the present embodiment is further applied to a display panel (not illustrated here), the display panel may have better display quality, rather than having mura phenomenon on the display panel caused by pressure difference generated between pixel electrodes due to the conventional coupling effect.

Figure 3:
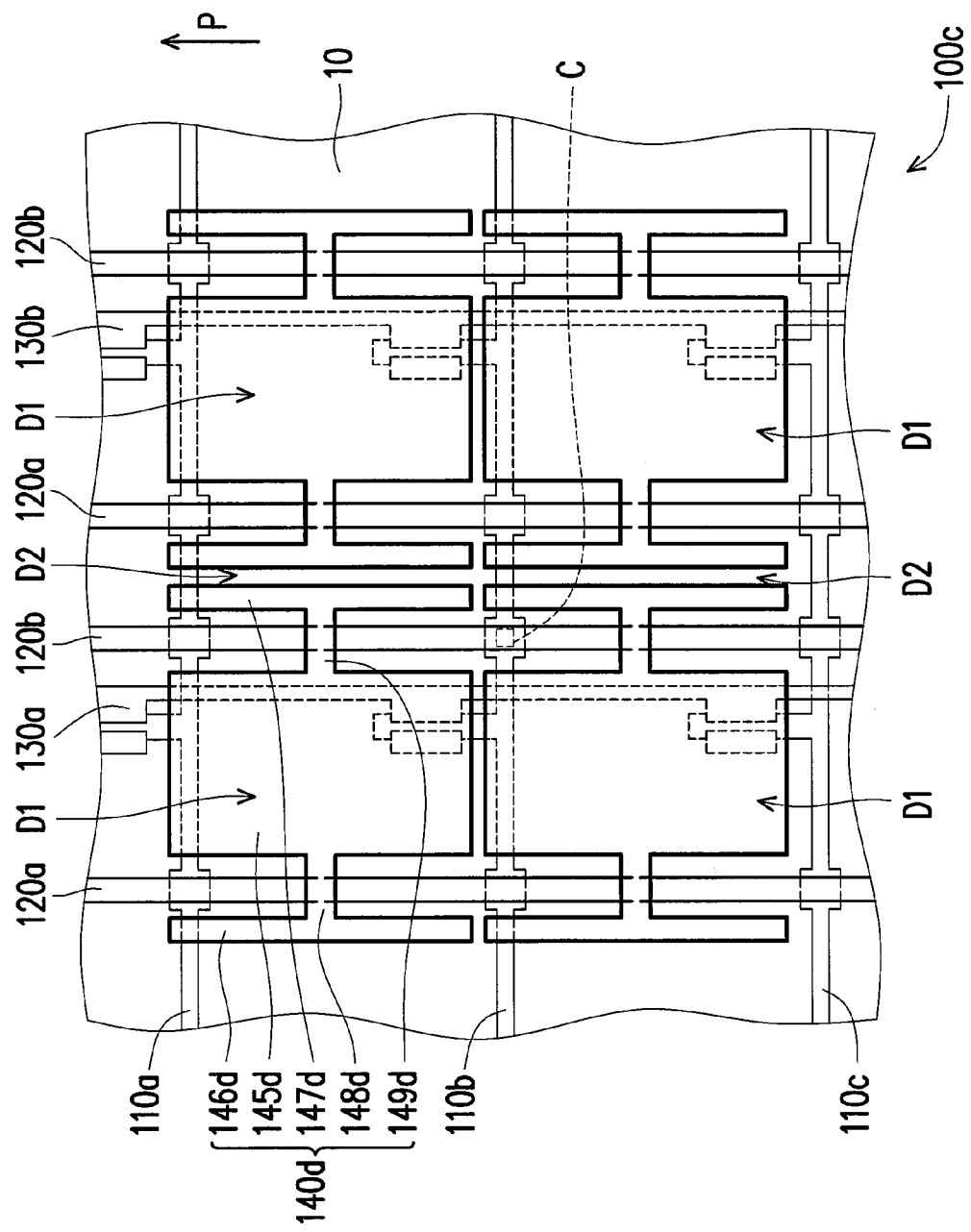
FIG. 3 illustrates a schematic view of a pixel array according to yet another embodiment of the invention.

FIG. 3 illustrates a schematic view of a pixel array according to yet another embodiment of the invention. First, referring to FIG. 1 and FIG. 3 together, a pixel array 100c of FIG. 3 is similar to the pixel array 100a of FIG. 1, while the main difference therebetween lies in that each pixel electrode 140d of the pixel array 100c in the present embodiment includes a first pixel electrode portion 145d, a second pixel electrode portion 146d, a third pixel electrode portion 147d, a first pixel electrode connecting portion 148d and a second pixel electrode connecting portion 149d. The first pixel electrode portion 145d is disposed between the second pixel electrode portion 146d and the third pixel electrode portion 147d. The first pixel electrode portion 145d is disposed inside the first unit region D1, and the second pixel electrode portion 146d and the third pixel electrode portion 147d are disposed inside the second unit region D2 adjacent to two sides of the first unit region D1, respectively. The first pixel electrode connecting portion 148d connects the first pixel electrode portion 145d and the second pixel electrode portion 146d, and the second pixel electrode connecting portion 149d connects the first pixel electrode portion 145d and the third pixel electrode 147d.

Furthermore, an area of the first pixel electrode portion 145d of the present embodiment is greater than an area of the second pixel electrode portion 146d and an area of the third pixel electrode portion 147d. An area of each pixel electrode 140d is substantially greater than an area of each first unit region D1. Orthographic projections of the first pixel electrode connecting portion 148d and the second pixel electrode connecting portion 149d on the substrate 10 is partially overlapped with orthographic projections of the corresponding gate lines 120a and 120b on the substrate 10. Since the orthographic projections of the first pixel electrode connecting portion 148d and the second pixel electrode connecting portion 149d of the pixel electrode 140d of the present embodiment on the substrate 10 is overlapped only in a small part with the orthographic projections of the corresponding gate lines 120a and 120b on the substrate 10, when the gate line 120b drives the scan line 110b through the contact hole C, a design of the pixel array 100c of the present embodiment can reduce a coupling effect between the gate line 120a and the pixel electrode 140d. For this reason, when the pixel array 100c of the present embodiment is further applied to a display panel (not illustrated here), the mura phenomenon on the display panel caused by pressure difference generated between pixel electrodes due to the conventional coupling effect can be substantially reduced and the display panel may have better display quality.

Accordingly, since the orthographic projections of the pixel electrodes on the substrate in the embodiments of the invention are non-overlapped with or incompletely overlapped with the orthographic projections of the corresponding gate lines on the substrate, a coupling effect can be reduced between the gate lines and the pixel electrodes with a design of the pixel array of the embodiments of the invention. Additionally, when the pixel array is further applied to a display panel, the mura phenomenon on the display panel caused by pressure difference generated between the pixel electrodes due to the conventional coupling effect can be substantially reduced and the display panel may have better display quality.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A pixel array, disposed on a substrate, the pixel array comprising:
 a plurality of scan lines arranged in parallel;
 a plurality of gate lines arranged in parallel and intersecting with the scan lines to demarcate a plurality of first unit regions and a plurality of second unit regions, wherein each of the gate lines electrically connects to one of the scan lines, the gate lines are arranged in different pitches, and an area of each of the second unit regions is smaller than an area of each of the first unit regions, and the first unit regions and the second unit regions are alternately arranged;
 a plurality of data lines intersecting with the scan lines and passing through the first unit regions, wherein each of the data lines is located between two of the adjacent gate lines; and
 a plurality of pixel structures disposed on the first unit regions, each of the pixel structures comprising an active device and a pixel electrode connecting with the active device, the active device being driven by a corresponding scan line and connecting with a corresponding data line, wherein an orthographic projection of each of the pixel electrodes on the substrate is non-overlapped with or incompletely overlapped with an orthographic projection of the corresponding gate lines on the substrate.

2. The pixel array as recited in claim 1, wherein an extending direction of the plurality of gate lines is parallel to an extending direction of the plurality of data lines.

3. The pixel array as recited in claim 1, wherein the gate lines and the scan lines are composed of different film layers, and the gate lines and the data lines are composed of a same film layer.

4. The pixel array as recited in claim 1, further comprising a contact hole, electrically connecting to each of the gate lines and one of a corresponding scan lines.

5. The pixel array as recited in claim 1, wherein each of the pixel electrodes extends and covers another corresponding scan line to form a storage capacitor.

6. The pixel array as recited in claim 1, wherein the pixel electrodes extend to the second unit regions and the two adjacent pixel electrodes in the longitudinal direction are in an interlaced arrangement.

7. The pixel array as recited in claim 6, wherein an area of each of the pixel electrodes is greater than an area of each of the first unit regions.

8. The pixel array as recited in claim 1, wherein an area of each of the pixel electrodes is smaller than the area of each of the first unit regions.

9. The pixel array as recited in claim 1, wherein each of the pixel electrodes comprises a first pixel electrode portion, a second pixel electrode portion, a third pixel electrode portion, a first pixel electrode connecting portion and a second pixel electrode connecting portion, the first pixel electrode portion is located between the second electrode portion and the third pixel electrode portion, the first pixel electrode portion is located in the first unit region, and the second pixel electrode portion and the third pixel electrode portion are respectively located in the plurality of second unit regions adjacent to two sides of the first unit region, the first pixel electrode connecting portion connects the first pixel electrode portion and the second pixel electrode portion, and the second pixel electrode connecting portion connects the first pixel electrode portion and the third pixel electrode portion.

10. The pixel array as recited in claim 9, wherein an area of the first pixel electrode portion is greater than an area of the second pixel electrode portion and an area of the third pixel electrode portion, and orthographic projections of the first pixel electrode connecting portion and the second pixel electrode connecting portion on the substrate are partially overlapped with orthographic projections of the corresponding gate lines on the substrate.

* * * * *